United States Patent [19]

Kroll

[11] Patent Number: 4,489,467

[45] Date of Patent: Dec. 25, 1984

[54] MOUNTING DEVICE FOR A ROD-SHAPED PROXIMITY SWITCH

[75] Inventor: Peter Kroll, Neuenhaus, Fed. Rep. of Germany

[73] Assignee: Gebhard Balluff Fabrik GmbH & Co., Neuhausen, Fed. Rep. of Germany

[21] Appl. No.: 368,733

[22] Filed: Apr. 15, 1982

[30] Foreign Application Priority Data

May 2, 1981 [DE] Fed. Rep. of Germany ....... 3117388

[51] Int. Cl.³ .................. H01R 4/36; A44B 21/00
[52] U.S. Cl. ................... 24/525; 24/135 N; 24/486; 24/569; 339/272 UC
[58] Field of Search .......... 24/243 B, 248 SA, 263 A, 24/255 SL, 135 R, 135 N; 339/244 R, 272 US

[56] References Cited

U.S. PATENT DOCUMENTS

| | | | |
|---|---|---|---|
| 1,273,922 | 7/1918 | Prattinger | 24/135 N |
| 1,790,610 | 1/1931 | Vindal | 24/263 A |
| 2,210,750 | 8/1940 | Cook et al. | 339/272 UC |
| 2,285,928 | 6/1942 | Jensen | 24/263 A |
| 2,469,542 | 5/1949 | Becker | 24/263 A |
| 2,686,642 | 8/1954 | Dobarganes et al. | 24/263 A |
| 2,766,502 | 10/1956 | Von Ranson | 24/243 B |
| 2,796,648 | 6/1957 | Peterson | 339/47 R |
| 3,516,049 | 6/1970 | Goodridge | 339/272 UC |
| 3,651,449 | 3/1972 | Hall et al. | 339/244 R |
| 3,766,925 | 10/1973 | Rubricius | 24/255 SL |

Primary Examiner—Victor N. Sakran

[57] ABSTRACT

Mounting device for a rod-shaped proximity switch which is constructed, apart from a tightening screw (10), as a one-piece injection moulded plastic part. The latter has a fastening part (12) provided with holes (14) for fastening bolts; at the ends of the fastening part (12), small block-shaped parts extending away from the fastening part to the side are moulded on, one of which forms a rigid clamping jaw (16) and the other, a small rigid supporting block (18). Between these two blocks there is a moveable clamping jaw (20), also designed to be shaped like a small block, which on the side facing away from the fastening part (12) is connected with the small rigid supporting block (18) by way of a flexible web (22). The small rigid supporting block (18) has, next to the fastening part (12), a threaded hole (24) for a tightening screw (10) to apply pressure to the moveable clamping jaw (20) in the direction of the rigid clamping jaw (16).

Each of the two clamping jaws (16, 20) has a channel (26, 28) in the side facing the other clamping jaw, whereby the channels (26, 28) are shaped so that their cross sections match the cross-sectional shape of the proximity switch (34).

8 Claims, 3 Drawing Figures

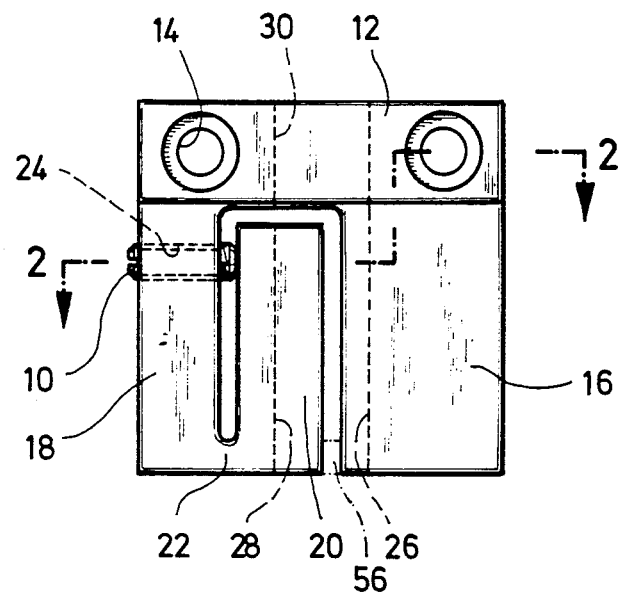
Fig. 1
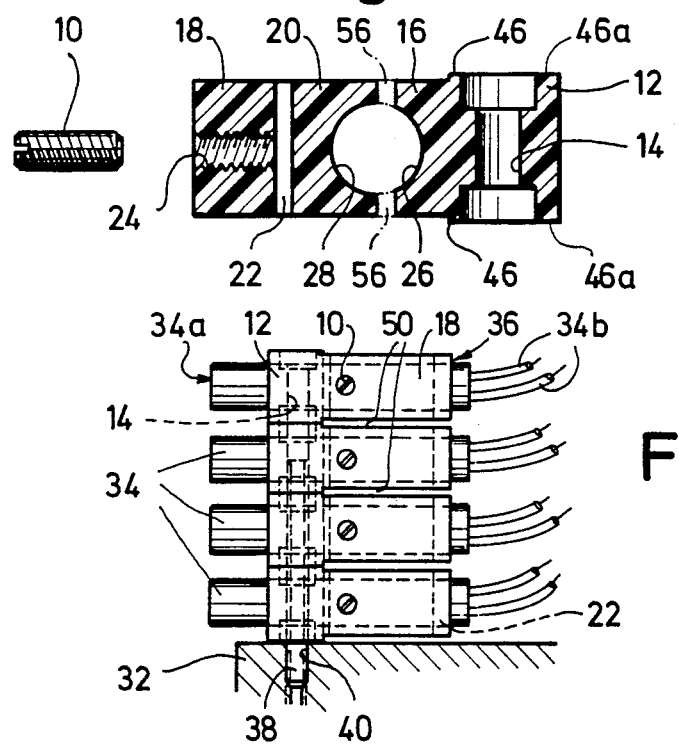
Fig. 2
Fig. 3

MOUNTING DEVICE FOR A ROD-SHAPED PROXIMITY SWITCH

Proximity switches usually have a tube-shaped housing made of metal or plastic, in which a sensing element such as an exploring coil as well as components of the circuit controlled by this sensing element are accommodated. The majority of these proximity switches are mounted directly on machines, and for only a minority of applications are the proximity switches accommodated in an additional housing, such as a multi-limit switch housing, which is then in turn mounted on the machine. The previously known devices for the direct mounting of proximity switches on machines and the like are unsatisfactory in various respects, especially with respect to the adjusting of the proximity switches, which must be adjustable in the direction of their longitudinal axis.

The invention was therefore based on the problem of creating a simple and inexpensive mounting device which can be used to mount a rod-shaped proximity switch rapidly and easily and at the same time would permit the proximity switch to be adjusted along its longitudinal axis. For the solution of this problem according to the invention, it is recommended that at least two clamping jaws for holding the proximity switch, each of which has a channel matched to the cross-sectional shape of the proximity switch, be arranged on a fastening part and, further, that the construction be designed such that at least one of the clamping jaws can be moved toward the other clamping jaw by means of an operating element. It is most expedient to provide the fastening part with several holes so that it can be fastened with bolts to a machine frame or the like. In this context, it should also be mentioned that the fastening part itself can be designed as a clamping jaw. The operating element can be a screw which can be used to move the movable clamping jaw toward the proximity switch, but it is also feasible to provide an eccentric equipped with a toggle or the like with which one of the clamping jaws can be pressed toward the proximity switch.

The mounting device according to the invention has the advantage that the construction of channels in the clamping jaws keeps the housings of the proximity switches and thus the proximity switches themselves from being damaged when being fastened and that the proximity switches can be moved and thus adjusted rapidly and easily along their longitudinal axis.

In order to prevent the proximity switch from also moving at right angles to its longitudinal axis when being clamped in place, it is recommended that one of the clamping jaws be connected rigidly with the fastening part, which also caters for the eventuality of the fastening part itself forming the rigid clamping jaw. Further, the direction of action of the operating element should be perpendicular to the longitudinal axis of the proximity switch so that the proximity switch does not move in its longitudinal direction when being clamped in place.

In order to permit the mounting device to be constructed to a large extent in one piece, it is recommended that the moveable clamping jaw be connected with the fastening part by way of an elastically deformable web.

An especially functional embodiment of the mounting device according to the invention is designed in such a way that two small oblong blocks approximately parallel to one another and rigidly connected with the fastening part extend away from the fastening part with transverse spacing between the blocks, the first of which forms one of the clamping jaws, whereby the moveable clamping jaw arranged between the two small blocks is connected with the second small block at the end facing away from the fastening part by way of an elastically deformable web. Such a mounting device can not only be constructed especially well in one piece, but it also has the advantage that the proximity switch is clamped most tightly at the end facing away from the sensor surface, i.e., at that end at which such a proximity switch is less sensitive to mechanical damage.

Finally, it is also possible for the mounting device to be designed as a one-piece, injection moulded plastic part so that it is especially inexpensive to manufacture. By using a snap mechanism or the like for clamping in the proximity switch, the operating element could even be moulded on, but if, for example, a tightening screw is used, the operating element forms a separate part.

The mounting device according to the invention is especially suitable for those applications where several proximity switches are to be mounted next to one another since mounting devices according to the invention can be combined into a stack by, for example, lining them up on fastening bolts and then fastening them as a block to a machine frame. The type of fastening according to the invention then permits the tightening screws to be arranged such that they can be operated from the side as is described and shown in detail in the following description and the attached drawings for a preferred embodiment of the mounting device according to the invention; the drawings show:

FIG. 1. A top view of the mounting device,

FIG. 2. A section on Line 2—2 in FIG. 1, and

FIG. 3. A side view of a stack of mounting devices according to the invention together with proximity switches.

As can be seen in FIGS. 1 and 2, the mounting device, aside from a tightening screw 10, consists of a single element which comprises a fastening part 12 with two holes 14 for fastening bolts, a rigid clamping jaw 16, a small rigid supporting block 18 and a moveable clamping jaw 20, which is connected with the small rigid supporting block 18 by way of a bendable web 22. According to the invention a threaded hole 24 for the tightening screw 10 runs parallel to the plane of the mounting device (plane of the drawing of FIG. 1), and this threaded hole is located in the small supporting block 18. According to a further characteristic of the invention, this threaded hole is arranged in such a way that the tightening screw 10 acts on the free end area of the moveable clamping jaw 20.

As is shown particularly clearly in FIG. 2, clamping jaws 16 and 20 contain channels 26 and 28, which have a profile according to the invention matching that of the proximity switch to be held-usually these proximity switches have a circular cross section. Finally, it is expedient for the fastening part to be provided with an opening 30 as an extension of the channels 26 and 28 so that the proximity switches are held by the relevant fastening part 12 so that their ends containing the sensing element are in a specified position. As FIG. 1 shows, the tightening screw 10 is positioned perpendicular to the channels 26, 28 and thus perpendicular to the axis of a proximity switch to be clamped so that the latter can be adjusted in a longitudinal direction and then fixed in place without there being any danger of a maladjustment.

FIG. 3 shows a machine part 32 or the like to which several proximity switches 34 are attached using mounting devices according to the invention. For this purpose, these mounting devices, which are designated as an aggregate by 36 in FIG. 3, are lined up on two fastening bolts 38, which can be screwed into threaded holes 40 of the machine part 32. The mounting devices 36 can be combined into a block in this fashion.

The proximity switches 34 are inserted into the mounting devices in such a way that their sensor surfaces 34a are located in the area of the fastening parts 12 of the mounting devices and connecting wires 34b lead away from the opposite end of the mounting devices. Since according to the invention the tightening screws 10 of every individual mounting device are accessible from the side, the proximity switches can be adjusted individually in the direction of their longitudinal axes and then clamped in place by tightening the tightening screws.

In order to prevent the moveability of the clamping jaws 20 from being impaired by the fastening parts 12 being drawn tightly against one another or against the machine part 32, the fastening parts according to the invention have projections 46 rising above the moveable clamping jaw 20 so that there is always a gap 50 between the moveable clamping jaws 20 of adjacent mounting devices as well as between the machine part 32 and the adjacent moveable clamping jaw 20. In addition, the contact surfaces 46a formed by the projections 46 are parallel to one another.

Examination of FIG. 1 also reveals that the forces to be applied with the tightening screw 10 have a relatively large lever arm because of the distance of the tightening screw from the web 22. Further, FIG. 2 shows that the proximity switches contact the clamping surfaces over a relatively large area so that the specific surface pressures occurring during clamping are not very high; therefore, there is no danger of damaging the proximity switches, which is not the case when fastening the proximity switches by means of a clamping screw acting directly on them.

As FIGS. 1 and 2 show, the clamping jaws 16, 18 could be connected with one another at the ends facing away from the tightening screw 10 by way of webs 56 indicated by dash-dotted lines.

What is claimed is:

1. A mounting device for a rod-shaped proximity switch, said mounting device comprising: a fastening part, a first clamping jaw rigidly connected to the fastening part and having a first groove-like clamping face, a second clamping jaw having a second groove-like clamping face, said first and second clamping faces defining a channel matched to the cross-sectional shape of the proximity switch, an elastically deformable web connecting said second clamping jaw to the fastening part, a tightening element for moving the second clamping jaw towards the first clamping jaw and means for mounting said tightening element on said fastening part, wherein the fastening part has a mounting portion, a first and a second oblong block rigidly connected to and extending away from the mounting part with transverse spacing between the blocks, said first block forming the first clamping jaw and said second block providing the mounting means for the tightening element, said second clamping jaw being arranged between said first and second block and connected with the second block at the end facing away from the mounting part by way of the web.

2. A mounting device as claimed in claim 1, wherein the clamping jaws are in the form of oblong blocks with parallel grooves facing each other and forming together said channel.

3. A mounting device as claimed in claim 1, wherein a tightening screw is provided between the second block and the second clamping jaw.

4. A mounting device as claimed in claim 3, wherein the tightening screw is arranged at the free end of the second clamping jaw.

5. A mounting device as claimed in claim 3 or 4, wherein the second block is provided with a threaded bore for the tightening screw.

6. A mounting device as claimed in claim 1, wherein the mounting part, the first and second blocks, the second clamping jaw and the web are provided by a one-piece injection moulded plastic part.

7. A mounting device as claimed in claim 1, wherein the fastening part has two bearing surfaces, one above and one below the clamping jaws, said bearing surfaces being parallel to one another.

8. A mounting device as claimed in claim 1, wherein the direction of action of the tightening element is perpendicular to the axis of the proximity switch.

* * * * *